(12) United States Patent
Taniguchi

(10) Patent No.: US 6,731,185 B2
(45) Date of Patent: May 4, 2004

(54) SURFACE ACOUSTIC WAVE DEVICE AND COMMUNICATION APPARATUS

(75) Inventor: Norio Taniguchi, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/132,284

(22) Filed: Apr. 26, 2002

(65) Prior Publication Data

US 2003/0006859 A1 Jan. 9, 2003

(30) Foreign Application Priority Data

Apr. 26, 2001 (JP) ......................... 2001-130252

(51) Int. Cl.[7] ................................ H03H 9/64
(52) U.S. Cl. .................. 333/133; 333/193; 333/198; 333/135
(58) Field of Search .................... 333/100, 124, 333/132, 133, 135, 187, 188, 189, 193, 198

(56) References Cited

U.S. PATENT DOCUMENTS

| | | |
|---|---|---|
| 5,543,757 A | 8/1996 | Kobayashi et al. |
| 5,592,135 A | 1/1997 | Taguchi et al. |
| 5,910,756 A * | 6/1999 | Ella .......................... 333/133 |
| 6,115,592 A * | 9/2000 | Ueda et al. ................ 455/307 |
| 6,208,224 B1 * | 3/2001 | Taniguchi et al. .......... 333/193 |
| 6,222,426 B1 * | 4/2001 | Komazaki et al. .......... 333/133 |
| 6,489,860 B1 * | 12/2002 | Ohashi ....................... 333/133 |
| 6,489,861 B2 * | 12/2002 | Noguchi et al. ............ 333/133 |

FOREIGN PATENT DOCUMENTS

| | | |
|---|---|---|
| JP | 05-167388 | 7/1993 |
| JP | 7-079128 | 3/1995 |
| JP | 7-086871 | 3/1995 |
| JP | 7-106912 | 4/1995 |
| JP | 7-212183 | 8/1995 |
| JP | 10-341135 | 12/1998 |
| JP | 11-68512 | 3/1999 |

* cited by examiner

Primary Examiner—Timothy P. Callahan
Assistant Examiner—An T. Luu
(74) Attorney, Agent, or Firm—Keating & Bennett, LLP

(57) ABSTRACT

A branching filter is a surface acoustic wave device in which a first filter having a relatively low bandpass frequency and a second filter having a relatively high bandpass frequency are connected to a common terminal. A junction-side resonator that is included in the second filter and that is connected in closest proximity to the common terminal is connected in series. The resonant frequency $f_{sr}$ of the junction-side resonator is higher than the center frequency $f_0$, which is the center of the passband, of the second filter, and is more preferably set so as to satisfy the expression: $f_0+BW\times0.2 \leq f_{sr} \leq f_0+BW\times0.7$, where BW is the bandwidth of the passband.

17 Claims, 10 Drawing Sheets

SURFACE ACOUSTIC WAVE DEVICE AND COMMUNICATION APPARATUS

BACKGROUND OF THE INVENTION

1. Field of the Invention

The present invention relates to surface acoustic wave devices and communication apparatuses including such surface acoustic wave devices. More particularly, the present invention relates to a surface acoustic wave device that is advantageously used as a surface acoustic wave branching filter and to a communication apparatus including such a surface acoustic wave device.

2. Description of the Related Art

Surface acoustic wave devices (hereinafter referred to as "SAW devices") include a surface acoustic wave element utilizing surface acoustic waves (SAWs) that propagate along the surface of a piezoelectric element, and are used in delay lines, filters, resonators, and other apparatuses. Since SAWs have a shorter wavelength than electromagnetic waves, they offer advantages in that, for example, SAW devices can be easily miniaturized. Thus, in the field of portable telephones and other electronic apparatuses, SAW devices are often used as filters in radio frequency circuits.

In recent years, particularly in the field of mobile communication, including portable telephones, there has been an increasing demand for further miniaturization and lower profile. Thus, SAW devices have also been required to be reduced in size and height. In particular, a portable telephone performs both transmission and reception in different frequency bands with a single antenna. Therefore, the demands on the use of SAW devices as branching filters are becoming greater.

Examples of technologies for such branching filters include a SAW branching filter disclosed in Japanese Unexamined Patent Application Publication No. 5-167388. This technology uses a plurality of SAW resonators (hereinafter simply referred to as "resonators"), as shown in FIG. 10, to constitute two SAW ladder filters (hereinafter may be referred to as "filters"). The filters are connected in parallel to define a branching filter.

More specifically, the branching filter uses ladder filters $F_i$ and $F_{ii}$ having a configuration in which series resonators S and parallel resonators P are alternately connected, and the filters $F_i$ and $F_{ii}$ are connected in parallel to a common terminal $T_0$. Among the resonators S and P that constitute the filters $F_i$ and $F_{ii}$, resonators $S_i$ and $S_{ii}$ that are directly connected to the common terminal $T_0$ are connected in series. When the filters $F_i$ and $F_{ii}$ are compared, the filter $F_{ii}$ has a relatively high bandpass frequency, and is used as a reception filter when used in a communication apparatus. On the other hand, the filter $F_i$ is used as a transmission filter.

As described above, with the branching filter being constituted by two SAW filters, and with respect to the filter $F_i$, the following filter characteristic (an impedance characteristic) is required. That is, the filter $F_i$ needs to have an impedance that is close to the impedance of the entire circuit in the passband of the filter $F_i$, and needs to have an impedance that is significantly larger than the impedance of the entire circuit in a rejection band that is a passband of the filter $F_{ii}$. When typical transversal SAW filters are used, it is not easy to achieve such a filter characteristic, resulting in a complicated circuit configuration of the entire branching circuit.

In contrast, the technology of Publication No. 5-167388 discussed above uses series resonators in which the resonators $S_i$ and $S_{ii}$ that are in closest proximity to the common terminal $T_0$ are connected in series. Thus, the series resonators allow matching of impedance characteristics of the filters. The series resonators can also be used for phase adjustment in the configuration of the entire branching filter. Consequently, the impedance in the rejection band outside the range of the passband becomes quite high relative to the circuit impedance, thus making it possible to achieve the impedance characteristic described above.

In addition, Japanese Unexamined Patent Application Publication No. 11-068512 discloses a branching filter that uses SAW filters having a configuration other than a ladder filter. This technology utilizes, in the same manner as Publication No. 5-167388 discussed above, series resonators as elements for phase adjustment for a branching filter configuration.

In the case of a configuration in which SAW ladder filters are used to constitute a branching filter as discussed above, when resonators that are directly connected to a common terminal are connected in series in each SAW filter, the resonators (series resonators) can function as elements for phase adjustment. The series-connected resonators can also be used for phase adjustment in a bandpass filter other than a SAW ladder filter.

In order to prevent the deterioration of the impedance characteristics of each SAW filter, the impedance and frequency of the series resonators are critical parameters that affect the characteristics of the entire branching filter. Thus, in the technology disclosed in Publication No. 11-068512, the frequency of the series resonators, and the resonant frequency in particular are designed to match the center frequency of the passband of the SAW filter. This makes it possible to effectively prevent a decrease in the impedance characteristics of the SAW filter including the series resonators.

In the technology of Publication No. 5-167388, the resonant frequency of the series resonators is not particularly limited. With a ladder filter, however, in order to prevent a decrease in the impedance characteristics, it is still preferable to match the resonant frequency of the series resonators to the center frequency of the passband of the SAW filter including the series resonators.

In the technologies of the related art, when the resonant frequency is matched to the center frequency of the passband of the SAW filter under the condition that the impedance of the series resonators is set to be high for phase adjustment, this causes a problem in that the passband width is reduced.

That is, since the series resonators are used for phase adjustment, there is a need to restrict the impedance to a high range. Consequently, changes in the impedance of the resonators become considerably sharp relative to changes in the frequency. In particular, the frequency dependence of the impedance is maximized between the resonant frequency and the anti-resonant frequency.

When the resonant frequency of the series resonators is set to be the same as the center frequency of the passband of the SAW filter, there is no particular problem in a frequency band lower than the center of the passband since the impedance of the series resonators is low. In contrast, in a frequency band higher than the center of the passband, a sharp change in the impedance causes the impedance of the series resonators to become high. This results in an unsatisfactory matching in the high band, so that the high band, which is supposed to be a pass band, effectively becomes a rejection band (elimination band), thereby reducing the passband width.

When the band width ratio is small, even matching the resonant frequency of the series resonators to the center frequency of the passband does not substantially reduce the passband width. However, when the band width ratio is large, there is a problem in that sufficient matching between the SAW filters cannot be achieved.

SUMMARY OF THE INVENTION

In order to overcome the problems described above, preferred embodiments of the present invention provide a SAW device, constituted by a plurality of SAW filters, that achieves an improved matching characteristic and that prevents a reduction in passband even in the case of a large band width ratio of each SAW filter when used as a branching filter. In addition, preferred embodiments of the present invention provide a communication apparatus including such a novel SAW device.

According to a preferred embodiment of the present invention, a SAW device includes a first SAW filter that has a relatively low bandpass frequency, a second SAW filter that has a relatively high bandpass frequency and that includes a plurality of SAW resonators, and a common terminal to which the first and second filters are connected. One of the SAW resonators which is connected in closest proximity to the common terminal is connected in series and has a resonant frequency that is higher than the center frequency of the passband of the second surface wave filter.

In the above configuration, among the plurality of SAW resonators (resonators) included in the second SAW filter (second filter), the resonant frequency of the resonator (junction-side resonator) adjacent to the common terminal, i.e., adjacent to a portion to which both the filters are connected, is higher than the center frequency of the passband of the second filter. Thus, the condition $f_0 < f_{sr}$ is satisfied, where $f_0$ is the center frequency and $f_{sr}$ is the resonant frequency of the junction-side resonator.

Typically, a SAW device having a configuration in which two SAW filters are connected to a common terminal is preferably used. In such a configuration, the junction-side resonator is also used as a matching element. For this reason, however, it is conventionally difficult to achieve satisfactory matching at a frequency higher than the resonant frequency, i.e., in a high band, so that the passband width is reduced.

In contrast, in the SAW device having the configuration according to preferred embodiments of the present invention, the center frequency $f_0$ of the passband of the second filter and the resonant frequency $f_{sr}$ of the junction-side resonator satisfies the condition $f_0 < f_{sr}$. This allows a reduction in the frequency dependence of the impedance in the passband. The present invention, therefore, can provide a branching filter that prevents the reduction of the passband.

According to another preferred embodiment of the present invention, a SAW device includes a first SAW filter that has a relatively low bandpass frequency, a second SAW filter that has a relatively high bandpass frequency and that includes a plurality of SAW resonators, and a common terminal to which the first and second filters are connected. One of the SAW resonators which is connected in closest proximity to the common terminal is connected in series and has a resonant frequency $f_{sr}$ that is within the range given by the expression:

$$f_0 + BW \times 0.2 \leq f_{sr} \leq f_0 + BW \times 0.7 \quad (1)$$

where $f_0$ is the center frequency of the passband and BW is the passband width of the second SAW filter.

Preferably, the resonant frequency $f_{sr}$ is within the range given by the expression:

$$f_0 + BW \times 0.3 \leq f_{sr} \leq f_0 + BW \times 0.6 \quad (2)$$

In the above configuration, the resonant frequency of the junction-side resonator included in the second filter is set in the range defined by expression (1), and preferably, within the range defined by expression (2). Consequently, the resonant frequency is further optimized, so that not only the passband can be prevented from being reduced, but also can be further broadened. This configuration, therefore, can provide a branching filter having a broader passband.

Preferably, the SAW filters are ladder-type filters.

In the above configuration, since the filters are of a ladder type, it is possible to ensure broadening of the passband and to provide a branching filter having improved performance.

The SAW device may further include matching device connected adjacent to the common terminal.

In the above-described configuration, the junction-side resonator functions as a phase-adjusting element, and the inclusion of the matching device can achieve satisfactory matching of the filters.

According to still another preferred embodiment of the present invention, a communication apparatus includes a SAW device having the configuration according to preferred embodiments described above. The SAW device is used as a branching filter.

In the above configuration, since the SAW device of various preferred embodiments of the present invention is used as a branching filter, it is possible to provide a communication apparatus having a highly favorable transmission and reception capability.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A first preferred embodiment of the present invention will be described below with reference to FIGS. 1 to 8. However, the present invention is not limited thereto.

A SAW device according to a first preferred embodiment of the present invention is a SAW branching filter in which two SAW filters are interconnected. The resonant frequency of a junction-side resonator, connected in series to a terminal adjacent to an antenna, that is included in one of the filters which has a relatively higher bandpass frequency, is preferably higher than the center frequency of the passband, and preferably at the shoulder area of a higher band in the passband. The SAW device can advantageously be used as a branching filter for a communication apparatus.

Figure 1:
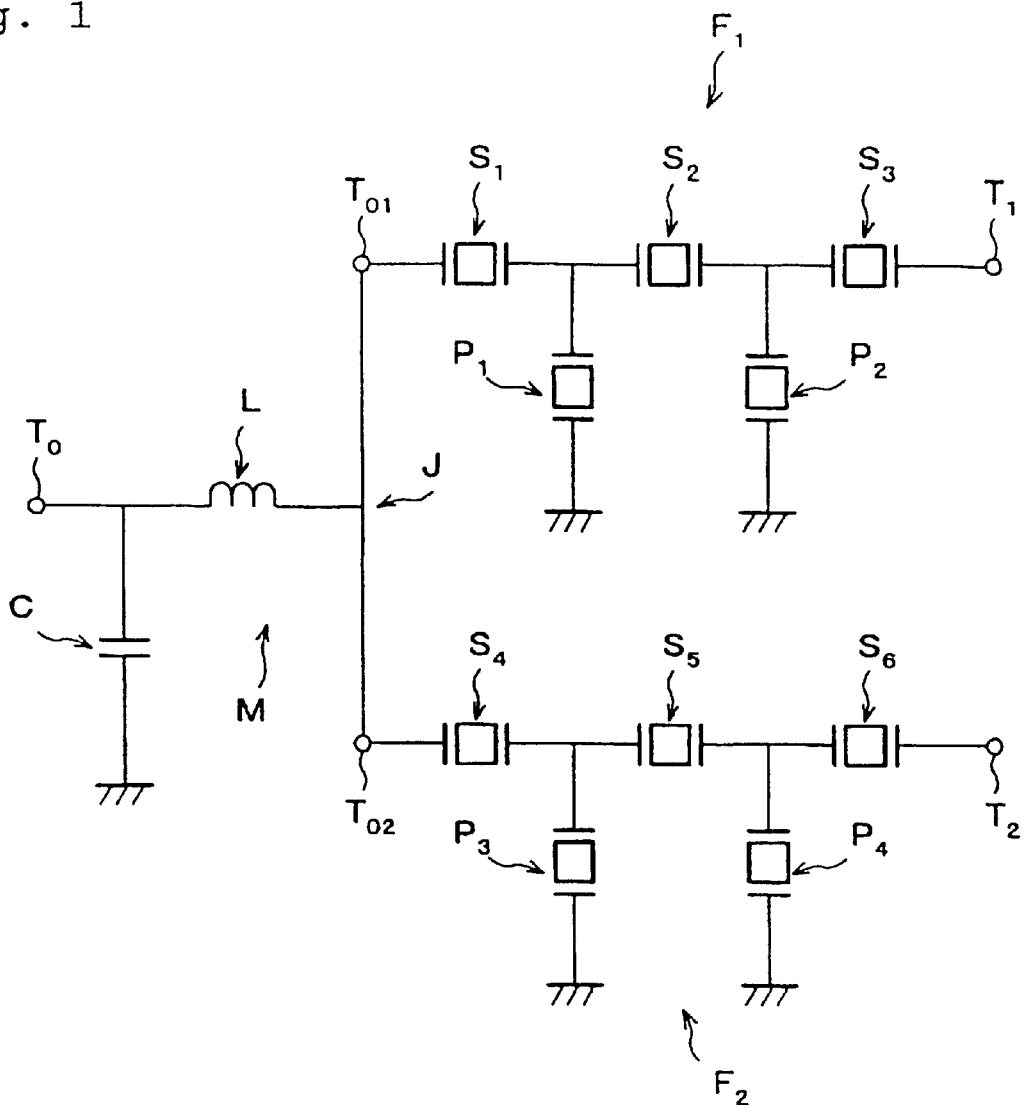
FIG. 1 is a schematic diagram illustrating the configuration of a SAW branching filter defining a SAW device according to a preferred embodiment of the present invention.

Referring now to FIG. 1, the SAW branching filter (hereinafter simply referred to as a "branching filter") according to this preferred embodiment includes a first bandpass filter $F_1$ having a relatively low bandpass frequency, a second bandpass filter $F_2$ having a relatively high bandpass frequency, and a common terminal $T_0$. The first bandpass filter $F_1$ and the second bandpass filter $F_2$ are connected in parallel to the common terminal $T_0$. The bandpass filters will be simply referred to as "filters" hereinafter, and SAW resonators will be simply referred to as "resonators".

In the present preferred embodiment, the first filter $F_1$ and the second filter $F_2$ are each a SAW ladder filter in which series resonators S, which are connected in series, and parallel resonators P, which are connected in parallel, are alternately connected.

Specifically, the first filter $F_1$ includes series resonators $S_1$, $S_2$, and $S_3$, and parallel resonators $P_1$ and $P_2$. The series resonators $S_1$, $S_2$, and $S_3$ are connected in series in this order. The parallel resonators $P_1$ and $P_2$ are connected in parallel to the series resonators $S_1$ to $S_3$. That is, the parallel resonator $P_1$ is connected in parallel between the series resonators $S_1$ and $S_2$, and the parallel resonator $P_2$ is connected in parallel between the series resonators $S_2$ and $S_3$.

The second filter $F_2$ includes series resonators $S_4$, $S_5$, and $S_6$, and parallel resonators $P_3$ and $P_4$. As in the first filter $F_1$, the series resonators $S_4$, $S_5$, and $S_6$ are connected in series in this order. The parallel resonators $P_3$ and $P_4$ are connected in parallel to the series resonators $S_4$ to $S_6$. That is, the parallel resonator $P_3$ is connected in parallel between the series resonators $S_4$ and $S_5$ and the parallel resonator $P_4$ is connected in parallel between the series resonators $S_5$ and $S_6$.

The first filter $F_1$ has a filter signal terminal $T_{01}$ adjacent to the series resonator $S_1$ and a filter signal terminal $T_1$ adjacent to the series resonator $S_3$. Similarly, the second filter $F_2$ has a filter signal terminal $T_{02}$ adjacent to the series resonator $S_4$ and a filter signal terminal $T_2$ adjacent to the series resonator $S_6$. The parallel resonators $P_1$ to $P_4$ are each connected to a ground line.

Among the filter signal terminals $T_{01}$, $T_1$, $T_{02}$, and $T_2$, the filter signal terminals $T_{01}$ and $T_{02}$ are connected to the common terminal $T_0$ through a matching circuit M, which is described later. Thus, the filters $F_1$ and $F_2$ are connected in parallel to the common terminal $T_0$.

For convenience of illustration, a portion at which the filter signal terminals $T_{01}$ and $T_{02}$ in the circuit are connected to the common terminal $T_0$ will be referred to as a "junction J". Among the series resonators S constituting the filters $F_1$ and $F_2$, for convenience of illustration, the series resonator $S_1$ and $S_4$ adjacent to the junction J will be referred to as "junction-side resonators".

Figure 2A:
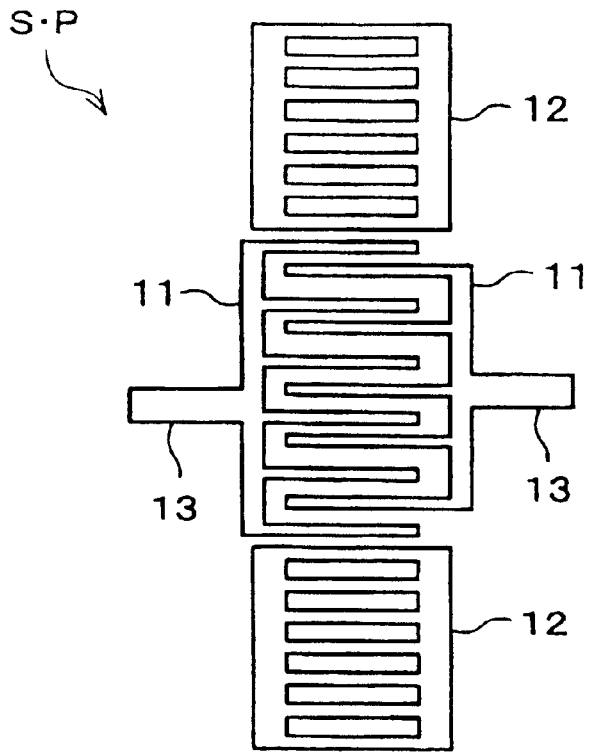
FIG. 2A is a schematic diagram illustrating the specific configuration of SAW resonators that constitute the branching filer shown in FIG. 1.
Figure 10:
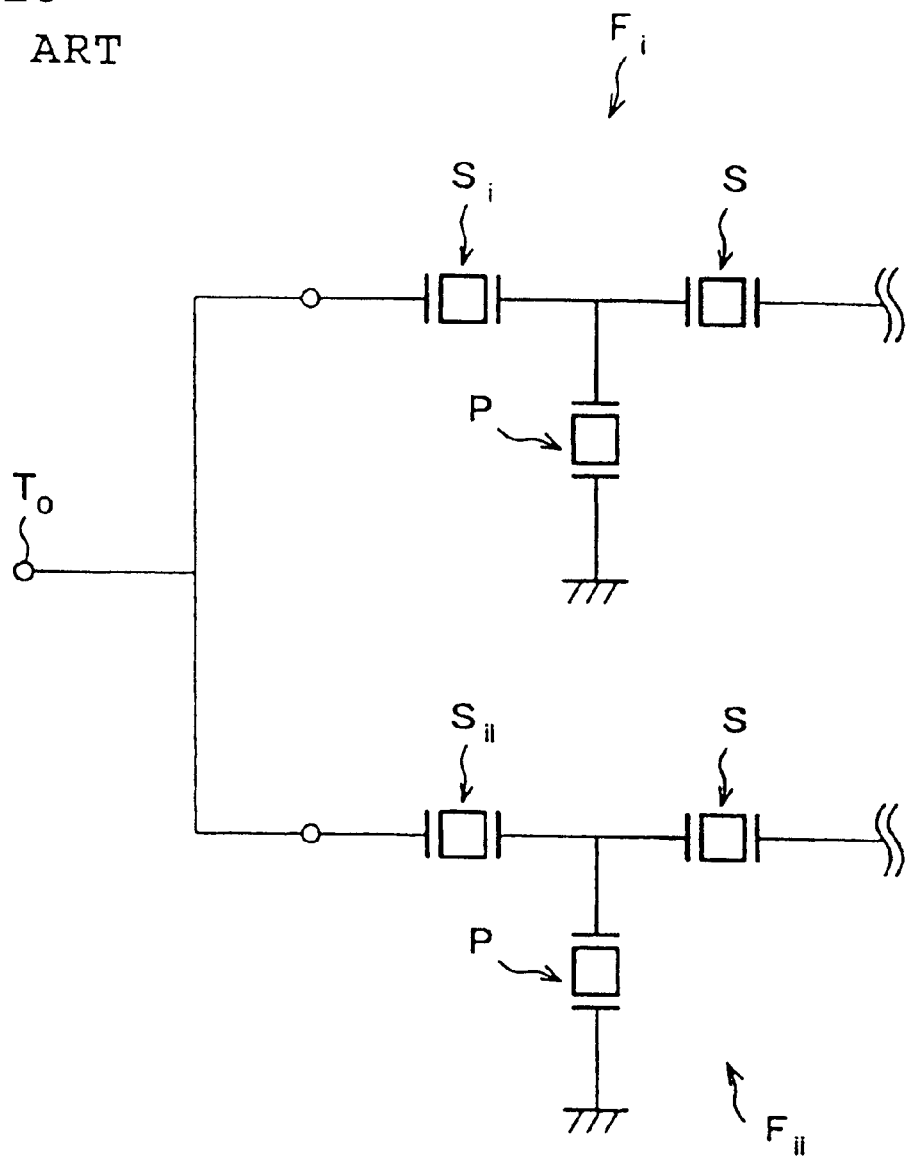
FIG. 10 is a schematic diagram illustrating the configuration of a SAW branching filter of the related art.

The series resonators $S_1$ to $S_6$ and the parallel resonators $P_1$ to $P_4$ are schematically shown in FIG. 1 (and in FIG. 10 for the configuration of the related art), and are more specifically shown in FIG. 2A in terms of functionality. As shown, the series resonators $S_1$ to $S_6$ and the parallel resonators $P_1$ to $P_4$ are SAW elements, which include two opposing interdigital drive electrodes 11 that are interlaced with each other, and two reflectors 12 arranged so as to sandwich the interdigital drive electrodes 11. The resonators S and P can also be configured with only interdigital drive electrodes 11, without the use of the reflectors 12.

The interdigital drive electrodes 11 are arranged such that a plurality of electrode fingers that extend from a pair of opposing terminals (bus bars) are interdigitated or interlaced with each other and the spacing between the electrode fingers is set on the basis of a desired resonant frequency. The pair of terminals are connected with corresponding connection lines 13. When the combination of two electrode fingers each extending from one of the opposing terminals is regarded as one pair, the number of pairs constituting the interdigital drive electrodes is appropriately set depending on the resonant frequency and so on. Similarly, the interdigital width between two adjacent electrode fingers, each extending from one of the opposing terminals, which are interdigitated, is also appropriately set as desired depending on the resonant frequency and so on.

Figure 2B:
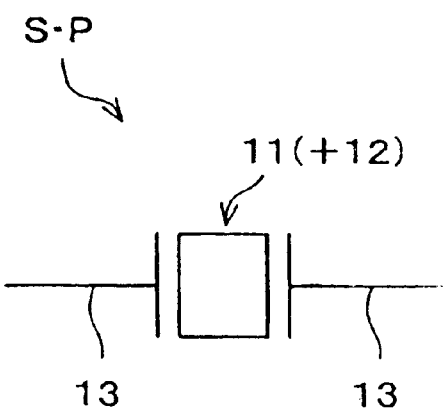
FIG. 2B is a schematic diagram corresponding to the configuration shown in FIG. 2A.

FIG. 2B specifically illustrates the relationship of the configuration of the resonators S and P shown in FIG. 2A and the configuration of the schematic view in FIG. 1. Thus, as shown in FIG. 2B, the square provided between the two connection lines 13 corresponds to the interdigital drive electrodes 11 (and reflectors 12).

With respect to a more specific configuration of the filters $F_1$ and $F_2$, the configuration thereof is not limited to the ladder-type configuration described above as long as the filters take the form of SAW filters. With respect to a more specific configuration of the resonators S and P, the configuration thereof is not limited to the configuration described above as long as the resonators take the form of SAW elements, and a conventionally known configuration may also be used.

Thus, the material for the electrodes and the method for forming the resonators S and P are not particularly limited either, and thus a typical material, such as Al, and a typical forming method may be used to form the resonators S and P. The piezoelectric substrate on which the resonators S and P are disposed is not particularly limited. Thus, various piezoelectric substrates, including a 64° Y-cut X-propagating $LiNbO_3$ substrate or a 36° Y-cut X-propagating $LiTaO_3$ substrate, or other suitable substrate, can be used.

As described above, the branching filter of this preferred embodiment preferably includes the filter signal terminals $T_1$ and $T_2$, which are respectively included in the filters $F_1$ and $F_2$, and the common terminal $T_0$, which interconnects the filters $F_1$ and $F_2$. Thus, when the branching filter is applied to a communication apparatus, as in a second preferred embodiment described later, an antenna is connected to the common terminal $T_0$, and a transmission unit and a reception unit are respectively connected to the signal terminals $T_1$ and $T_2$. This allows for the use of the SAW device having the above configuration as a preferable branching filter.

In addition, as shown in FIG. 1, it is preferable that a matching circuit M, including an inductance element L, a capacitance element C, and a delay line (not shown), be added to the junction J. The inductance element L is connected in series to each of the filters $F_1$ and $F_2$ via the coupling unit J, while the capacitance element C is connected in parallel to the inductance element L. These elements may also be included in the same package.

The configuration of the matching circuit M is not limited to the configuration in which the series inductance element L and the parallel capacitance element C are included, as long as the matching circuit has such a configuration that functions as a matching device, and thus various types of matching devices can be used. For example, a configuration in which a parallel inductance element and a series capacitance element are included may be used. Alternatively, various other matching elements, for example, a combination of strip lines, may be used.

In addition, at least the first and second filters $F_1$ and $F_2$ may be included in a single package, i.e., may be integrally packaged. Similarly, the matching circuit M may be packaged integrally with the filters $F_1$ and $F_2$, or alternatively, may be adapted for external connection. Thus, the packaging for the branching filter according to the present invention is not particularly limited.

In the branching filter described above, of the series resonators $S_1$ and $S_4$ in closest proximity to the junction J, the junction-side resonator $S_4$ included in the second filter $F_2$ has a resonant frequency that is higher than the center frequency of the passband of the second filter $F_2$. Thus, the condition $f_0 < f_{sr}$ is satisfied, where $f_0$ is the center frequency and $f_{sr}$ is the resonant frequency of the junction-side resonator $S_4$.

The junction-side resonator $S_4$ can be used not only as an element that constitutes the second filter $F_2$ but also as a phase adjusting element for coupling the first and second filters $F_1$ and $F_2$. Accordingly, the impedance of the junction-side resonator $S_4$ is high relative to the other resonators $S_5$ and $S_6$. Consequently, when the resonant frequency $f_{sr}$ of the junction-side resonator $S_4$ is set to the center frequency $f_0$ of the passband of the second filter $F_2$, it is impossible to achieve satisfactory matching at a frequency higher than the resonant frequency $f_{sr}$, i.e., in a high band. As a result, the high band, which is supposed to be a pass band, effectively becomes a rejection band (elimination band), thereby reducing the passband width.

In addition, since the impedance of the junction-side resonator $S_4$ is relatively high, the frequency dependence of the impedance of the junction-side resonator $S_4$ is significantly increased. In this preferred embodiment, as described above, the matching circuit M is added to the common terminal $T_0$. However, only the matching circuit M connected externally in that manner cannot provide satisfactory matching.

When the band width ratio is small, even matching the resonant frequency of the junction-side resonator to the center frequency does not substantially cause the passband width to be reduced. However, when the band width ratio is large, i.e., when the passband is broad, sufficient matching between the SAW filters cannot be achieved.

As described above, with the configuration of the related art, the passband is substantially reduced. In preferred embodiments of the present invention, however, the resonant frequency of the junction-side resonator that is included in the SAW filter (the second filter $F_2$ in FIG. 1) having a relatively high passband frequency is shifted toward a higher frequency in the passband. This makes it possible to reduce the frequency dependence of the impedance in the passband, so that the reduction of the passband can be prevented.

In preferred embodiments of the present invention, it is sufficient if the resonant frequency $f_{sr}$ of the junction-side resonator $S_4$, which is included in the second filter $F_2$, is higher than the center frequency $f_0$, and more preferably, the resonant frequency $f_{sr}$ is within the range given by the expression:

$$f_0 + BW \times 0.2 \leq f_{sr} \leq f_0 + BW \times 0.7 \tag{1}$$

Figure 3:
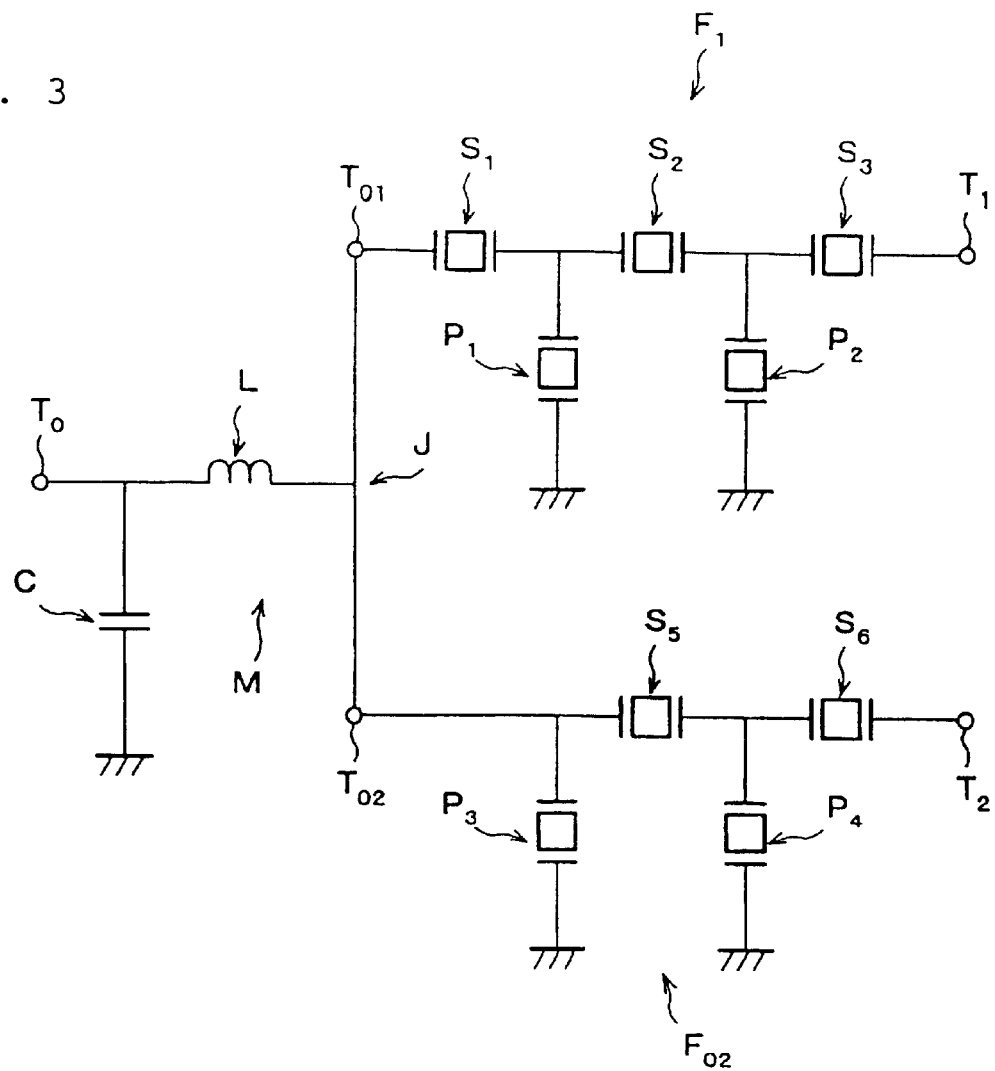
FIG. 3 is a schematic diagram of a configuration in which a junction-side resonator is eliminated from the branching filter shown in FIG. 1.

In expression (1), strictly speaking, the center frequency $f_0$ corresponds to the center frequency of a second filter $F_{02}$ of a branching filter having a configuration, as shown in FIG. 3, in which the resonator $S_4$ is eliminated from the second filter $F_2$ shown in FIG. 1. "BW" represents the passband width (bandwidth).

When the resonant frequency $f_{sr}$ is in the range given by expression (1), not only can the passband be prevented from being reduced, but it can also be broadened. In contrast, when the resonant frequency $f_{sr}$ is less than $f_0 + BW \times 0.2$, this is a value that is too close to the center frequency $f_0$ to broaden the bandwidth sufficiently. On the other hand, when the resonant frequency $f_{sr}$ exceeds $f_0 + BW \times 0.7$, the resonant frequency $f_{sr}$ is too high to broaden the bandwidth sufficiently.

Additionally, in other preferred embodiments of the present invention, it is particularly preferable that the resonant frequency $f_{sr}$ be within the range given by the expression:

$$f_0 + BW \times 0.3 \leq f_{sr} \leq f_0 + BW \times 0.6 \tag{2}$$

When the resonant frequency $f_{sr}$ is in this range, the passband can be broadened further. The reasons why the resonant frequency $f_{sr}$ that is within the range given by expression (1), and more preferably, within the range given by expression (2) is desirable will be described in more detail in conjunction with an example described later.

The junction-side resonator $S_4$ is not limited to the specific configuration described above. Thus, in the above example, the junction-side resonator $S_4$ takes a single-element configuration, which includes one SAW element. However, the present invention is not limited thereto. For example, a multi-element configuration in which two or more SAW elements are connected in series may be used, and designing the total impedance of the multi-element configuration to be the same can provide a similar advantage.

Thus, when resonators are connected in series in multiple stages to provide a multi-element configuration, resonant frequencies within a section between the element terminals in the multi-element configuration are combined into a single frequency. Thus, even when the junction-side resonator $S_4$ is arranged in a multi-element configuration, it is sufficient if the combined resonant frequency of a group of series resonators connected in the "section between the element terminals" in the multi-element configuration is within the range given by each expression described above.

Figure 4:
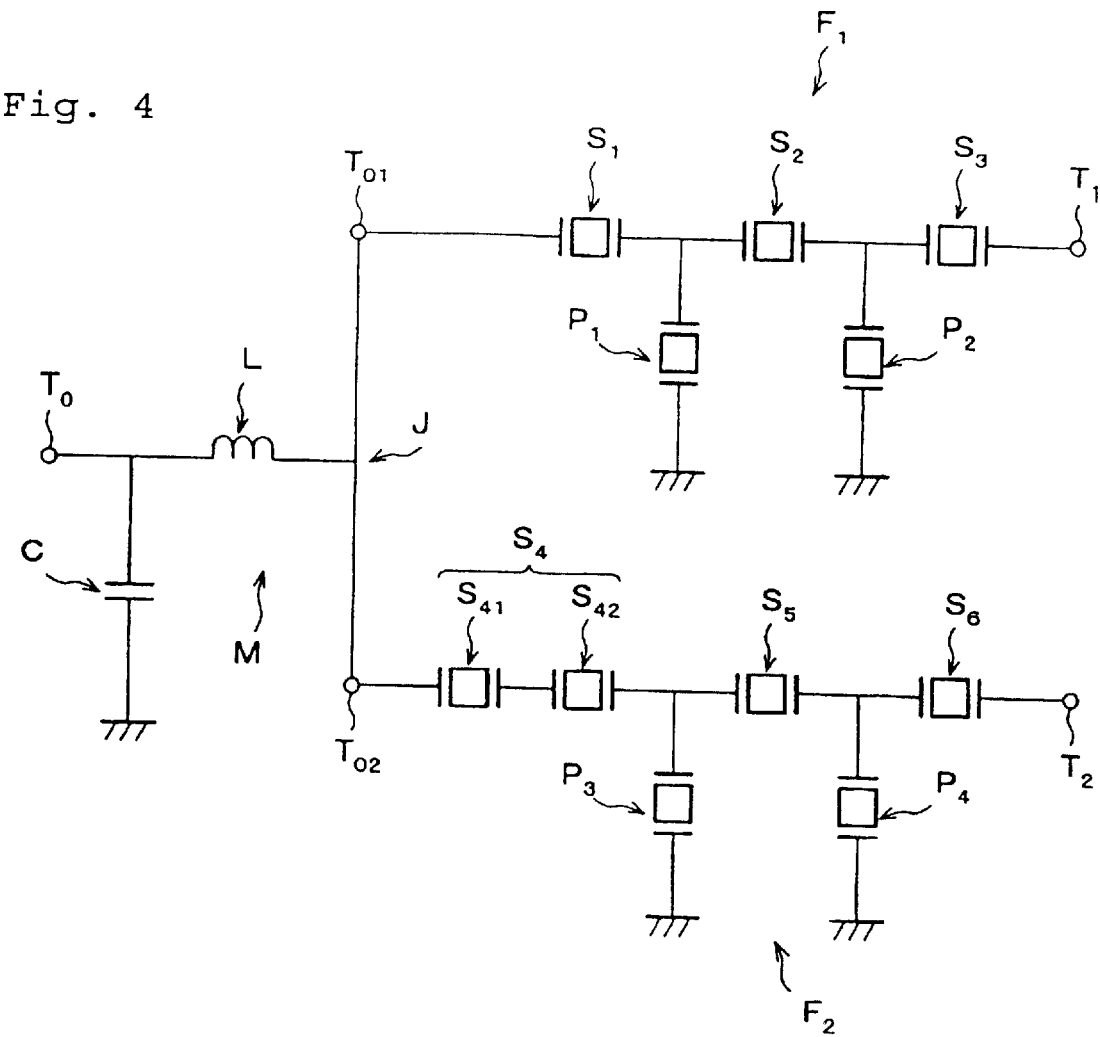
FIG. 4 is a schematic diagram illustrating a modification of the branching filter shown in FIG. 1.

For example, as shown in FIG. 4, it is now assumed that the junction-side resonator $S_4$ is constituted by two series resonators S, i.e., $S_{41}$ and $S_{42}$, and the resonant frequencies $f_{sr1}$ and $f_{sr2}$ of the series resonators $S_{41}$ and $S_{42}$ are different from each other, i.e., $f_{sr1} \neq f_{sr2}$. In this case, the "section between the element terminals" corresponds to the section between the resonant terminal $T_0$ and an element terminal $t_{43}$ that is a portion to which the parallel resonator $P_3$ is connected. Here, when a resonant frequency $f_{sr0}$ that is the combination of the resonant frequencies $f_{sr1}$ and $f_{sr2}$ of the series resonators $S_{41}$ and $S_{42}$ is within the range of expression (1) and preferably in the range of expression (2), the resonators $S_{41}$ and $S_{42}$ practically constitute a single junction-side resonator $S_4$. As a result, such a configuration can theoretically provide the same advantage.

In addition, in various preferred embodiments of the present invention, it is highly preferable that the matching circuit M is provided as well as the junction-side resonator $S_4$. This allows more satisfactory matching of the filters $F_1$ and $F_2$.

Now, an example of preferred embodiments of the present invention will be described.

The range of the resonant frequency $f_{sr}$, which is given in expression (1) or preferably in expression (2), of the junction-side resonator $S_4$ of this preferred embodiment will be described in more detail in accordance with the following example. This example is used merely to provide the range of the resonant frequency $f_{sr}$ shown in each expression (1) and (2), and thus, the present invention is not limited thereto.

A branching filter in this example is constituted by the first and second filters $F_1$ and $F_2$, as shown in FIG. 1, which are both SAW ladder filters. The first filter $F_1$ had a bandpass in the range of about 1,920 MHz to about 1,980 MHz, while the second filter $F_2$ had a bandpass in the range of about 2,110 MHz to about 2,170 MHz.

As a piezoelectric substrate on which the filters $F_1$ and $F_2$ were disposed, a 64° Y-cut X-propagating LiNbO$_3$ substrate was used. As shown in FIGS. 2A and 2B, the interdigital drive electrodes 11, etc. were formed of an Al-based electrode material on the substrate, to provide the series resonators $S_1$ to $S_6$ and the parallel resonators $P_1$ to $P_4$. The resulting structure was packaged to provide a branching filter having the circuit configuration shown in FIG. 1. The electrode parameters of the resonators $S_1$ to $S_6$ and $P_1$ to $P_4$ are shown in Table 1, in which the number of pairs and the interdigital width of the interdigital drive electrodes 11 constituted by the resonators are also shown.

TABLE 1

| | Resonant Frequency (MHz) | Number of Pairs | Interdigital Width (μm) |
|---|---|---|---|
| First Filter $F_1$ | | | |
| Series Resonator $S_1$ | 1975 | 84 | 50 |
| Series Resonator $S_2$ | 1975 | 55 | 40 |
| Series Resonator $S_3$ | 1975 | 84 | 50 |
| Parallel Resonator $P_1$ | 1865 | 80 | 63 |
| Parallel Resonator $P_2$ | 1865 | 80 | 63 |
| Second Filter $F_2$ | | | |
| Series Resonator $S_4$ | [see Table 2] | 90 | 16 |
| Series | 2145 | 100 | 22 |

TABLE 1-continued

| | Resonant Frequency (MHz) | Number of Pairs | Interdigital Width (μm) |
|---|---|---|---|
| Resonator $S_5$ | | | |
| Series Resonator $S_6$ | 2145 | 130 | 50 |
| Parallel Resonator $P_3$ | 2051 | 90 | 60 |
| Parallel Resonator $P_4$ | 2051 | 90 | 60 |

The matching circuit M was added to the junction J of the filters $F_1$ and $F_2$. The matching circuit M was provided outside the package. In the matching circuit M, the inductance element L (3.5 nH) was connected in series and the capacitance element C (2 pF) was connected in parallel, as shown in FIG. 1.

With this arrangement, the frequency of the junction-side resonator $S_4$ was varied from level 1 to level 10, as shown in Table 2, and the relationship with the filter characteristics of the second filter $F_2$ was evaluated. In Table 2, the frequency is increased in the order of level 1 to level 10, and level 3 indicates the ladder filter of the related art in which the resonant frequency $f_{sr}$ was set to the center frequency $f_0$ of the passband. Thus, the frequency difference is also increased in the order of level 1 to level 10, and becomes 0 MHz at level 3.

TABLE 2

| Series Resonator $S_4$ | Resonant Frequency (MHz) | Frequency Difference (MHz) |
|---|---|---|
| Level 1 | 2125 | −20 |
| Level 2 | 2135 | −10 |
| Level 3 | 2145 | 0 |
| Level 4 | 2155 | +10 |
| Level 5 | 2165 | +20 |
| Level 6 | 2175 | +30 |
| Level 7 | 2185 | +40 |
| Level 8 | 2195 | +50 |
| Level 9 | 2205 | +60 |
| Level 10 | 2215 | +70 |

As a comparative example for the branching filter having the above configuration, as shown in FIG. 3, a comparative branching filter including the second filter $F_{02}$ from which the junction-side resonator $S_4$ was eliminated in the configuration shown in FIG. 1 was used. The filter characteristics of the second filter $F_{02}$ in the comparative branching filter were used to define the characteristics of the branching filter having the configuration according to preferred embodiments of the present invention.

The center frequency $f_0$ of filter characteristics of the comparative branching filter was about 2,145 MHz and the 3 dB-bandwidth BW was about 90 MHz, and the frequency difference $f_{sr}'$ between the resonant frequency $f_{sr}$ of the junction-side resonator $S_4$ and the center frequency $f_0$ was defined by the expression:

$$f_{sr}' = (f_{sr} - f_0)/BW \quad (3)$$

Figure 5:
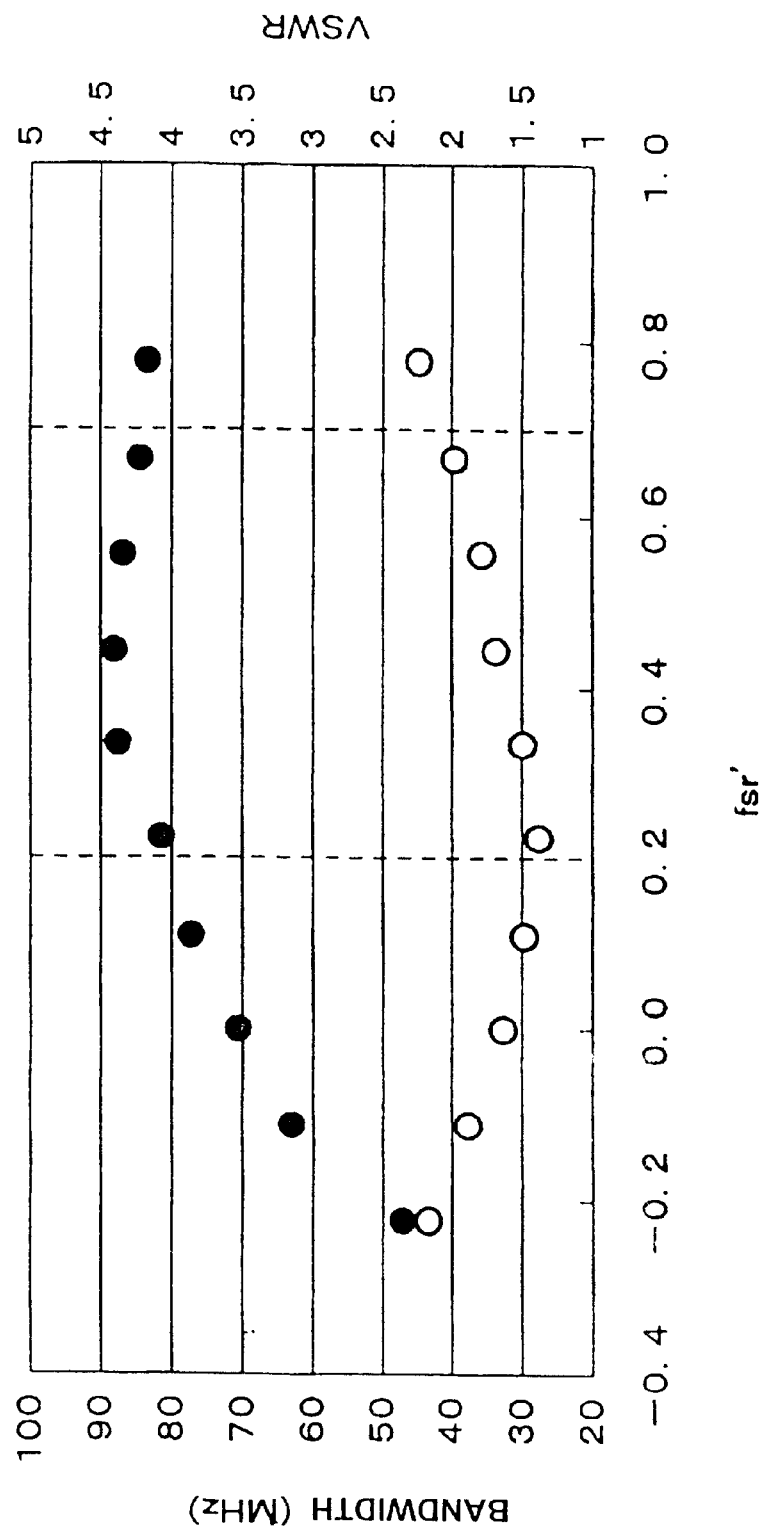
FIG. 5 is a graph showing the relationships of the frequency difference between the resonant frequency of the junction-side resonator and the center frequency of a second filter, the bandwidth, and the VSWR.

FIG. 5 is a graph in which the horizontal axis indicates the frequency difference $f_{sr}'$ and the vertical axis indicates the bandwidth and the voltage standing wave ratio (VSWR) of filter characteristics of the branching filter of preferred embodiments of the present invention. In the graph of FIG. 5, $f_{sr}'=0$ corresponds to the center frequency $f_0$ of the passband of the filter, and fsr'=0.5 corresponds to the upper limit in a higher band in the passband in a communication system having a loss specification of about 3 dB at fsr'=0.5. Black dots indicate the values of the bandwidth, and white dots indicate the values of the VSWR. To what dB the bandwidth BW should be set depends on the specification of a communication system, and thus is not limited to a specific value.

As can be seen from FIG. 5, setting the resonant frequency $f_{sr}$ to be in a higher band in the passband provides a broader bandwidth, i.e., passband width, than setting the resonant frequency $f_{sr}$ to match the center frequency $f_0$ of the passband of the second filter $F_2$ ($f_{sr}'=0$).

In particular, when the frequency difference $f_{sr}'$ is in the range of about 0.2 to about 0.7, the VSWR also becomes 2 or below (VSWR≦2), so that the reflection characteristics are improved, thus making it possible to broaden the bandwidth. Additionally, when the frequency difference $f_{sr}'$ is in the range of about 0.3 to about 0.6, the bandwidth becomes a maximum, thus providing a significant advantage when designing the bandwidth of the second filter $F_2$ to be broad.

When the results that are clear from the graph in FIG. 5 are summarized, it follows that the resonant frequency $f_{sr}$ of the junction-side resonator $S_4$ is within the range of expression (1), and preferably, expression (2).

Figure 6:
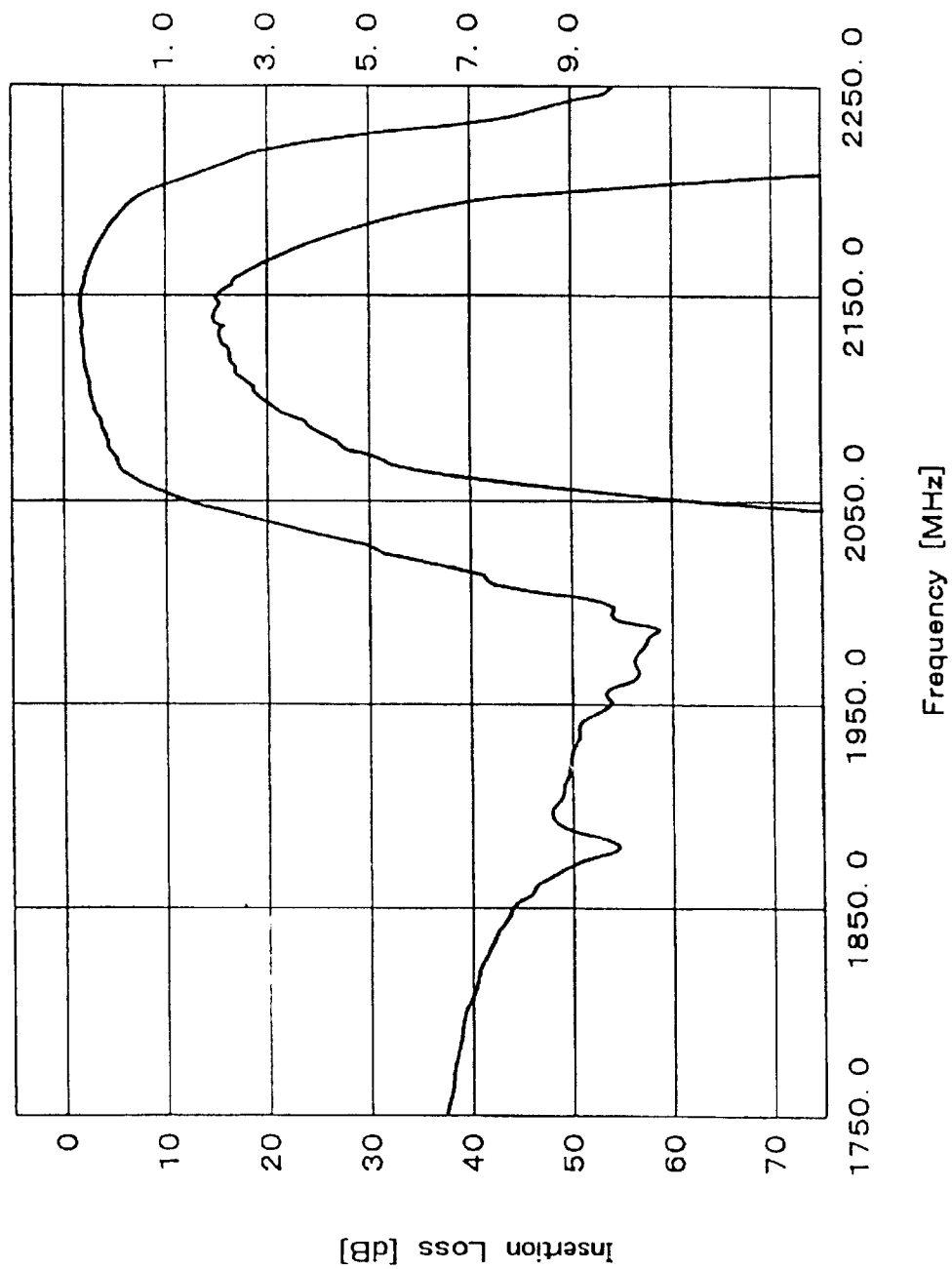
FIG. 6 is a graph showing the filter characteristic of the branching filter shown in FIG. 1 when the resonant frequency of the junction-side resonator is set according to a known method.
Figure 7:
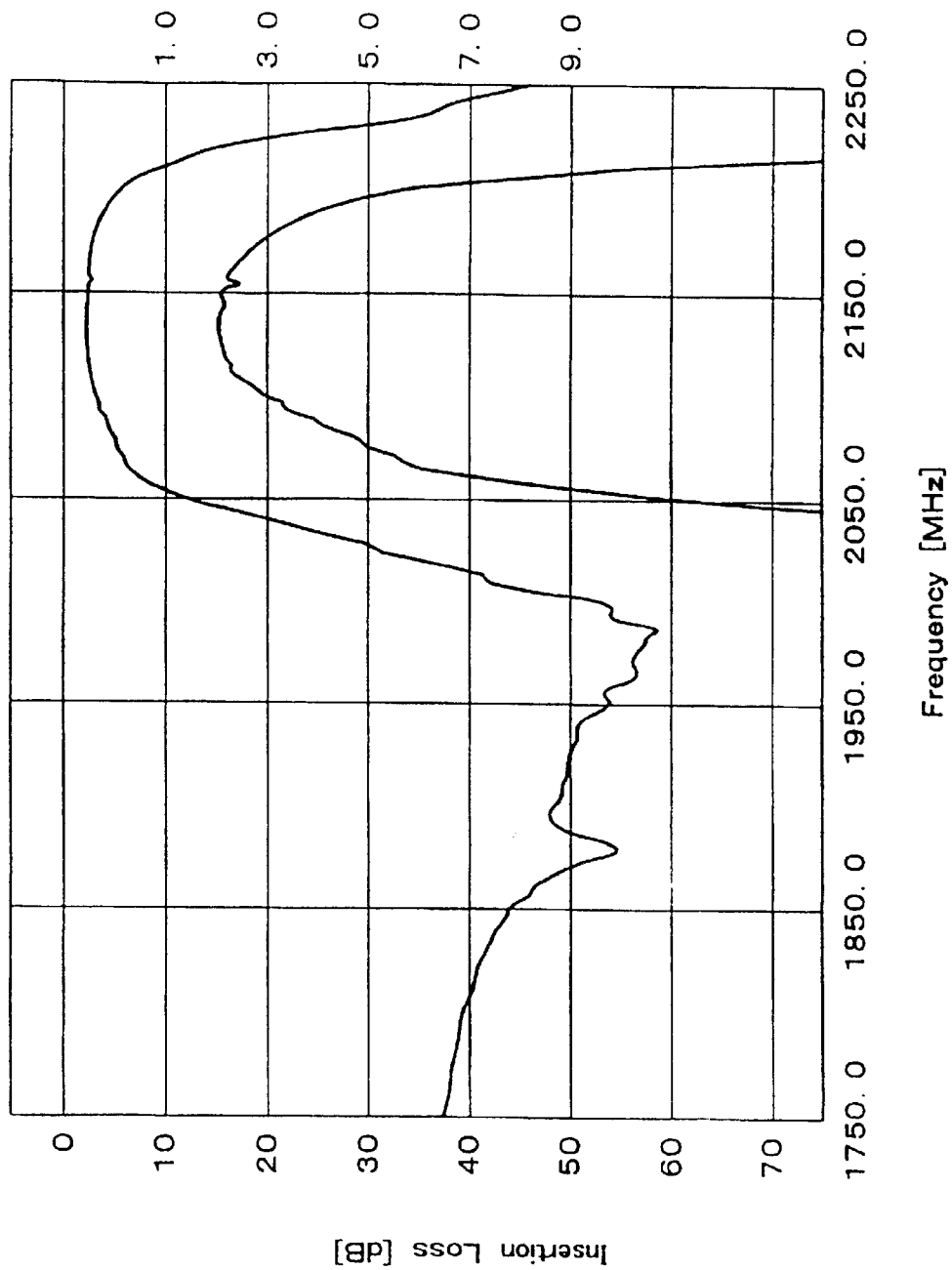
FIG. 7 is a graph showing the filter characteristic of the branching filter shown in FIG. 1 when the resonant frequency of the junction-side resonator is set to satisfy expression (1)
Figure 8:
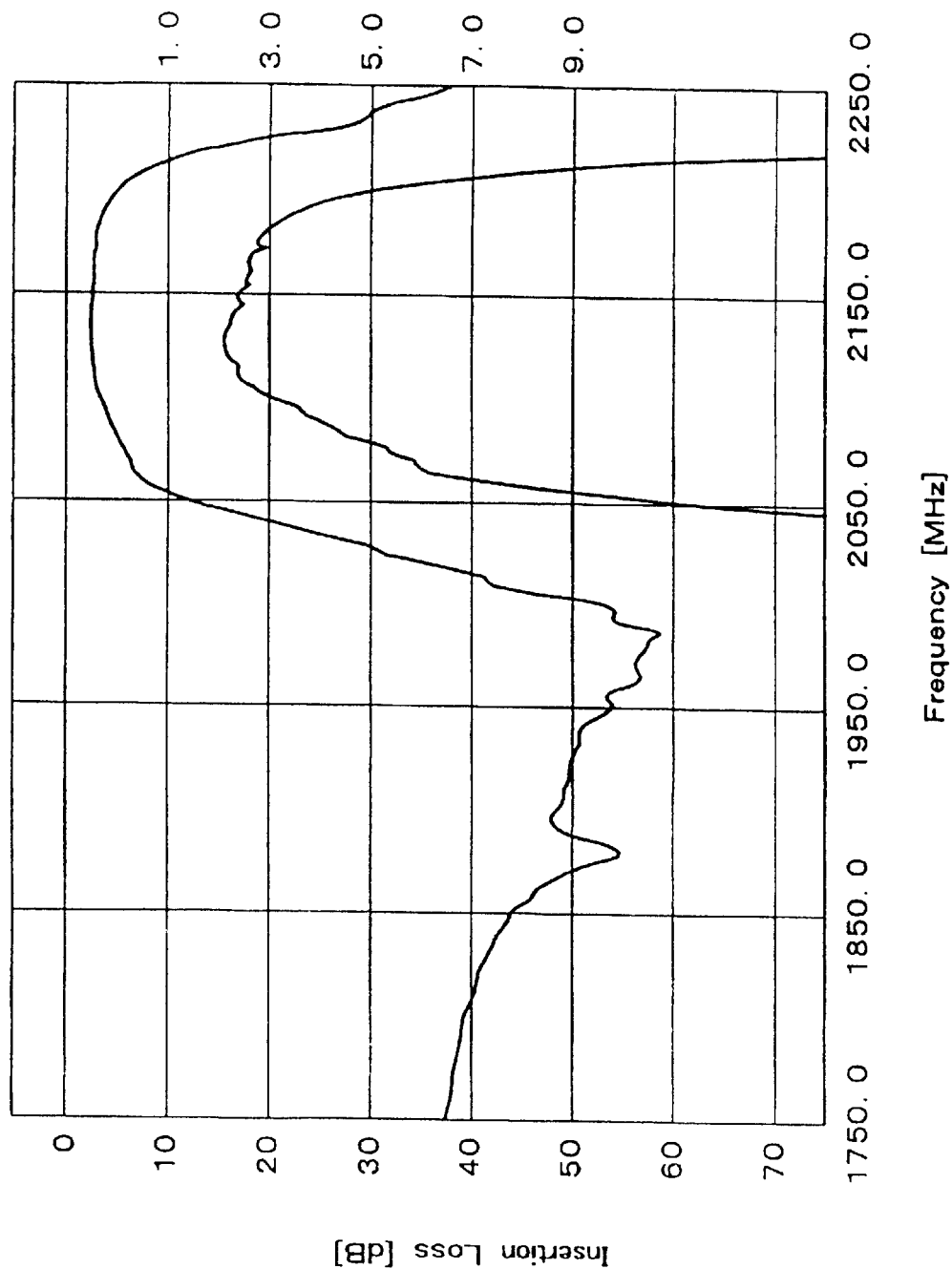
FIG. 8 is a graph showing the filter characteristic of the branching filter shown in FIG. 1 when the resonant frequency of the junction-side resonator is set to satisfy expression (2)

FIG. 6 shows filter characteristics of the second filter $F_2$ in the case in which the resonant frequency $f_{sr}$ of the junction-side resonator $S_4$ is the center frequency $f_0$, i.e., in the case of level 3 ($f_{sr}'=0$), which is the setting of the related art, in Table 2. Likewise, FIG. 7 shows filter characteristics of the second filter $F_2$ in the case of level 5 (fsr'=0.22) in Table 2, i.e., in the case in which the resonant frequency $f_{sr}$ is in the range of expression (1). Further, FIG. 8 shows filter characteristics of the second filter $F_2$ in the case of level 7 (fsr'=0.44) in Table 2, i.e., in the case in which the resonant frequency $f_{sr}$ is in the range of expression (2). In FIGS. 6 to 8, the vertical axis indicates the insertion loss and the horizontal axis indicates the frequency.

As is apparent from the results shown in each figure, the filter characteristic having a configuration within the range of expression (1) has a broader bandwidth than the filter characteristic of the configuration of the related art. In addition, the figures show that the filter characteristic having a configuration within the range of expression (2) has an even broader bandwidth.

In this manner, according to preferred embodiments of the present invention, in a SAW branching filter in which SAW filters having two different pass bands are coupled, the resonant frequency of a junction-side resonator included in a SAW filter having a relatively high frequency is preferably higher than the center frequency of the passband of the SAW filter. As a result, the passband can be prevented from being reduced, and setting the resonant frequency in an appropriate range can further broaden the passband.

While the configuration using ladder filters as the SAW filters has been illustrated in preferred embodiments of the present invention, the present invention is not limited thereto, and thus various SAW filters can be used.

A preferred second embodiment of the present invention will now be described with reference to FIG. 9, which should not be considered limiting. For convenience of illustration, elements having the same functions as those included in the first preferred embodiment are denoted with the same reference numerals, and the description thereof will be omitted.

In the following description of this second preferred embodiment, a case in which the SAW branching filter of the first preferred embodiment is applied to a communication apparatus will be specifically illustrated.

Figure 9:
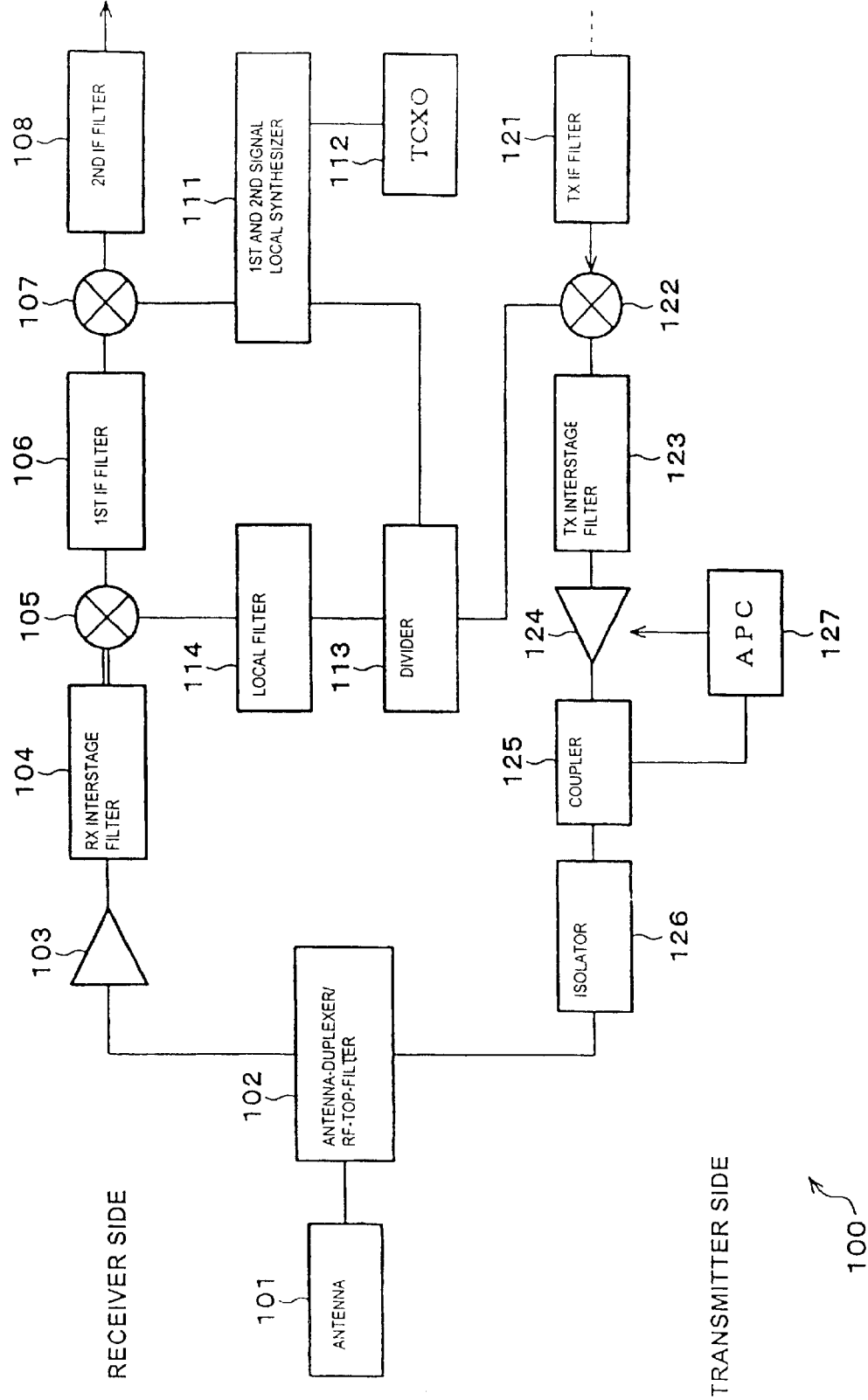
FIG. 9 is a block diagram illustrating the critical portion of a communication apparatus according to another preferred embodiment of the present invention.

Referring now to FIG. 9, a communication apparatus 100 according to this preferred embodiment has a receiver (Rx) and a transmitter (Tx). More specifically, the receiver (Rx), which performs reception, includes an antenna 101, an antenna-duplexer/RF-top-filter 102, an amplifier 103, an Rx interstage filter 104, a mixer 105, a first IF filter 106, a mixer 107, a second IF filter 108, a first-and-second-signal local synthesizer 111, TCXO (temperature compensated crystal oscillator) 112, a divider 113, and a local filter 114.

The transmitter (tx), which performs transmission, also uses the antenna 101 and the antenna-duplexer/RF-top-filter 102, and includes a Tx IF filter 121, a mixer 122, a Tx interstage filter 123, an amplifier 124, a coupler 125, an isolator 126, and an APC (automatic power control) 127.

The SAW branching filter in the first preferred embodiment can advantageously be used as the antenna-duplexer/RF-top-filter 102.

In this manner, the communication apparatus of this preferred embodiment includes the SAW branching filter of the first preferred embodiment, thus making it possible to achieve highly satisfactory transmission and reception capabilities.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device comprising:
   a first surface acoustic wave filter having a relatively low bandpass frequency;
   a second surface acoustic wave filter having a relatively high bandpass frequency and including a plurality of surface acoustic wave resonators; and
   a common terminal to which the first and second filters are connected;
   wherein one of the surface acoustic wave resonators which is connected in closest proximity to the common terminal is connected in series and has a resonant frequency that is higher than the center frequency of the passband of the second surface wave filter; and
   said one of the surface acoustic wave resonators which is connected in closest proximity to the common terminal has a resonant frequency $f_{sr}$ that is within the range given by the expression:

$$f_0+BW\times 0.3 \leq f_{sr} \leq f_0+BW\times 0.6.$$

where $f_0$ is the center frequency of the passband and BW is the passband width of the second surface acoustic wave filter.

2. A surface acoustic wave device according to claim 1, wherein the surface acoustic wave filters are ladder-type filters.

3. A surface acoustic wave device according to claim 1, further comprising a matching device connected adjacent to the common terminal.

4. A communication apparatus comprising a surface acoustic wave device according to claim 1, wherein the surface acoustic wave device defines a branching filter.

5. A surface acoustic wave device according to claim 1, wherein the first surface acoustic wave filter and the second surface acoustic wave filter are connected in parallel to the common terminal.

6. A surface acoustic wave device according to claim 1, wherein each of the first surface acoustic wave filter and the second surface acoustic wave filter is a SAW ladder filter including series resonators S, which are connected in series, and parallel resonators P, which are connected in parallel.

7. A surface acoustic wave device according to claim 3, wherein the matching device includes an inductance element, a capacitance element, and a delay line.

8. A surface acoustic wave device according to claim 1, further comprising a package wherein the first and second surface acoustic wave filters are included in the package.

9. A surface acoustic wave device comprising:
   a first surface acoustic wave filter having a relatively low bandpass frequency;
   a second surface acoustic wave filter having a relatively high bandpass frequency and including a plurality of surface acoustic wave resonators; and
   a common terminal to which the first and second filters are connected;
   wherein one of the surface acoustic wave resonators which is connected in closest proximity to the common terminal is connected in series and has a resonant frequency $f_{sr}$ that is within the range given by the expression:

$$f_0 + BW \times 0.2 \leq f_{sr} \leq f_0 + BW \times 0.7,$$

where $f_0$ is the center frequency of the passband and BW is the passband width of the second surface acoustic wave filter.

10. A surface acoustic wave device according to claim 9, wherein the resonant frequency $f_{sr}$ is within the range given by the expression: $f_0 + BW \times 0.3 \leq f_{sr} \leq f_0 + BW \times 0.6$.

11. A surface acoustic wave device according to claim 9, wherein the surface acoustic wave filters are ladder-type filters.

12. A surface acoustic wave device according to claim 9, further comprising a matching device connected adjacent to the common terminal.

13. A communication apparatus comprising a surface acoustic wave device according to claim 9, wherein the surface acoustic wave device defines a branching filter.

14. A surface acoustic wave device according to claim 9, wherein the first surface acoustic wave filter and the second surface acoustic wave filter are connected in parallel to the common terminal.

15. A surface acoustic wave device according to claim 9, wherein each of the first surface acoustic wave filter and the second surface acoustic wave filter is a SAW ladder filter including series resonators S, which are connected in series, and parallel resonators P, which are connected in parallel.

16. A surface acoustic wave device according to claim 13, wherein the matching device includes an inductance element, a capacitance element, and a delay line.

17. A surface acoustic wave device according to claim 9, further comprising a package wherein the first and second surface acoustic wave filters are included in the package.

* * * * *